US007138307B2

United States Patent
Ranade et al.

(10) Patent No.: US 7,138,307 B2
(45) Date of Patent: Nov. 21, 2006

(54) METHOD TO PRODUCE HIGHLY DOPED POLYSILICON THIN FILMS

(75) Inventors: Pushkar Ranade, Hillsboro, OR (US); Ibrahim Ban, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/912,632

(22) Filed: Aug. 4, 2004

(65) Prior Publication Data

US 2006/0030109 A1 Feb. 9, 2006

(51) Int. Cl.
*H01L 21/00* (2006.01)

(52) U.S. Cl. ..................................... 438/166

(58) Field of Classification Search .............. 438/151, 438/153, 154, 157, 166, 257, 258, 199, 223, 438/224, 229, 232, 197, 275, 283, 285, 293, 438/299, 301, 306, 479, 482, 486–488, 491, 438/514–515, 517, 527, 529–532, 795, 798, 438/923, 969, 535, 542, 545–549, 551–552, 438/559, 565, 585, 587–588, 592, 647, 657–684, 438/763–766, 768–769, 564
See application file for complete search history.

(56) References Cited

U.S. PATENT DOCUMENTS

| | | | | | |
|---|---|---|---|---|---|
| 4,584,760 | A | * | 4/1986 | Okazawa | 438/592 |
| 5,256,894 | A | * | 10/1993 | Shino | 257/388 |
| 5,985,698 | A | * | 11/1999 | Gonzalez et al. | 438/128 |
| 6,156,613 | A | * | 12/2000 | Wu | 438/300 |
| 6,190,977 | B1 | * | 2/2001 | Wu | 438/300 |
| 6,660,587 | B1 | * | 12/2003 | Ahn et al. | 438/257 |
| 6,770,551 | B1 | * | 8/2004 | Sun | 438/592 |
| 6,844,259 | B1 | * | 1/2005 | Cheong | 438/657 |
| 6,855,584 | B1 | * | 2/2005 | Yamazaki et al. | 438/166 |
| 2002/0072197 | A1 | * | 6/2002 | Kang et al. | 438/424 |
| 2003/0139038 | A1 | * | 7/2003 | Sun | 438/682 |
| 2003/0186533 | A1 | * | 10/2003 | Cheong | 438/629 |
| 2004/0157353 | A1 | * | 8/2004 | Ouyang et al. | 438/38 |

* cited by examiner

*Primary Examiner*—Michael Lebentritt
*Assistant Examiner*—Andre' C. Stevenson
(74) *Attorney, Agent, or Firm*—Blakely, Sokoloff, Taylor & Zafman LLP (57) ABSTRACT

The present invention describes a method of forming a highly doped polysilicon film. According to an embodiment of the present invention, a first silicon film is formed on a substrate. The first silicon film is then doped. Next, a second silicon film is formed on the doped first silicon film. The second silicon film is then doped.

32 Claims, 4 Drawing Sheets

METHOD TO PRODUCE HIGHLY DOPED POLYSILICON THIN FILMS

BACKGROUND OF THE INVENTION

1. Field of the Invention

The present invention relates to the field of semiconductor manufacturing and more specifically to a method of forming a highly doped polysilicon thin film.

2. Discussion of Related Art

Figure 1A:
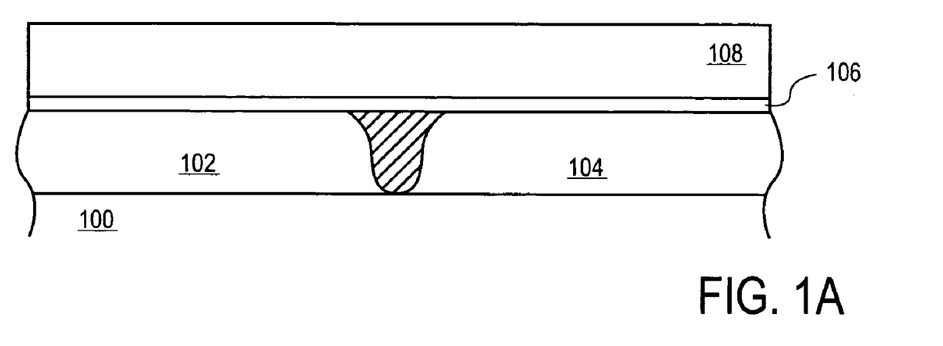
FIGS. 1A–1C illustrate a method of forming a conventional CMOS integrated circuit having a PMOS device and an NMOS device with polysilicon gate electrode.
Figure 1B:
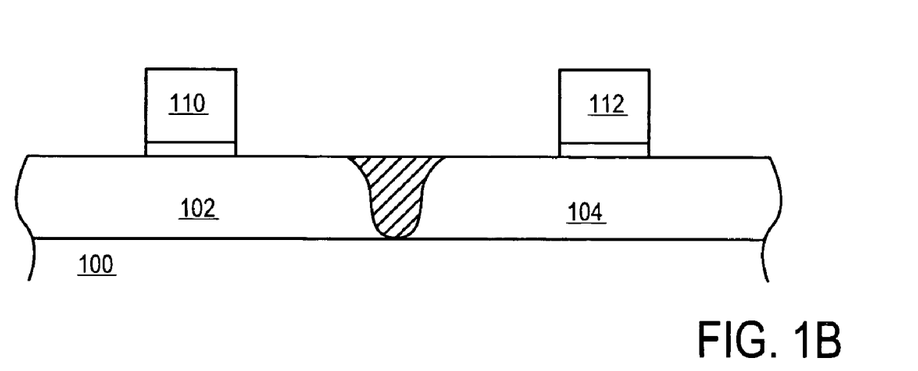
Figure 1C:
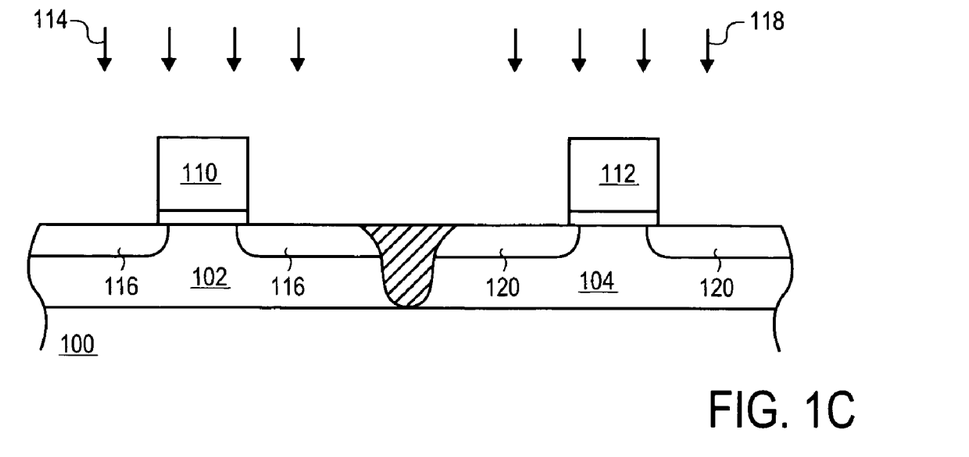

Conventional complementary metal oxide semiconductor (CMOS) integrated circuits are fabricated with doped polysilicon gate electrodes. An example of a conventional method of fabricating a CMOS integrated circuit is illustrated in FIG. 1A-1C. First, as shown in FIG. 1A, a gate dielectric layer 106 is formed over a p type region 102 and an n type region 104 of a silicon monocrystalline substrate 100. A polycrystalline silicon film 108 is then blanket deposited over the gate dielectric layer 106 as shown in FIG. 1A. The polycrystalline silicon film is then patterned with conventional techniques into gate electrodes 110 and 112 as shown in FIG. 1B.

Next, as shown in FIG. 1C, n type dopants 114 are implanted into the p type region to form n type source/drain regions 116 and p type dopants 118 are implanted into the n type region 104 to form n type source/drain regions 120. The source/drain implants are also used to dope the undoped polysilicon film of gate electrodes 110 and 112 to n type and p type conductivity, respectively. A high temperature activation anneal, such as a rapid thermal anneal is then used to activate the dopants.

"Poly depletion" effects are becoming a limiting factor in one's ability to further scale device dimensions so that higher density and more complex integrated circuit can be fabricated. "Poly depletion" is caused by the fact that the ion implantation and activation anneal are unable to obtain a sufficiently high dopant concentration at the gate electrode/gate oxide interface resulting in a larger effective thickness of the gate oxide which degrades device performance. In order to increase the active dopant concentration at the gate electrode/gate dielectric interface, it has been proposed to increase the implant energy/dose and/or to utilize higher temperature activation annealing. Increasing anneal temperatures can lead to excessive diffusion of dopants in the junction regions degrading device performance. Additionally, increasing the implant energy/dose can lead to the penetration of dopants through the gate oxide. Additionally, it has been suggested to use ultra fast annealing techniques, such as laser annealing, to increase the dopant activation and concentration at the interface. Unfortunately, laser annealing processes can be difficult to control and laser annealing patterned polysilicon features can cause melting of the polysilicon feature resulting in defects, such as poly "feet".

DETAILED DESCRIPTION OF THE PRESENT INVENTION

The present invention describes a method to produce highly doped polysilicon thin films. In the following description numerous specific details have been set forth in order to provide a thorough understanding of the present invention. In other instances, well known semiconductor fabrication techniques and equipment have not been set forth in particular detail in order to not unnecessarily obscure the present invention.

Embodiments of the present invention, describe a method of forming a highly doped polysilicon thin film which can be used to form gate electrodes for CMOS integrated circuits. The present invention utilizes a bi-layer approach to form highly doped polysilicon thin films. According to embodiments of the present invention, first a thin polysilicon or amorphous silicon film is formed over a substrate. The thin film is then doped by, for example, a low energy ion implantation process. The dopants are then activated utilizing an ultra fast annealing process, such as a laser anneal process. Next, a thick capping layer of undoped polysilicon is deposited over the thin doped polysilicon layer. The thicker polysilicon capping layer and the thin doped polysilicon layer are then patterned into, for example, a gate electrode. Ion implantation and rapid thermal anneling can then be used to form the source/drain regions adjacent to the gate electrode and to dope the thicker undoped polysilicon capping layer.

The dual bi-layer technique of the present invention, enables a highly doped polysilicon thin film to be fabricated. By first forming an initial thin polysilicon film and then doping the thin film and activating the dopants with a ultra fast annealing process, such as a laser annealing system that utilizes a very high temperature, a high activation efficiency of dopants can be achieved in the thin polysilicon layer. Additionally, because a thin film is first formed and doped, a short duration anneal process can be used and excessive diffusion minimized. Additionally, because a thin layer of polysilicon is initially doped, a low energy ion implantation process can be used which minimizes implants straggle through the film and gate oxide layer and into the substrate. Laser annealing prior to polysilicon patterning avoids the formation of defects, such as polysilicon feet which can occur when patterned films melt when exposed to laser annealing. The bi-layer approach of the present invention enables the lower portion of the polysilicon gate electrode adjacent to the gate dielectric layer to be highly doped thereby reducing poly depletion effects and improving device performance.

FIGS. 2A–2J illustrate a method of forming a highly doped polysilicon film. The present invention, will be described with respect to an exemplary method of forming highly doped polysilicon gate electrodes in a CMOS integrated circuit fabrication process. It is to be appreciated that the present is not to be limited to the fabrication of gate electrodes for CMOS integrated circuits and can be used in the manufacture of gate electrodes for just a PMOS device or just an NMOS device and can be used to fabricate any type of device, such as but not limited to bipolar transistor and a polysilicon capacitors, where highly doped polysilicon films are desired.

Figure 2A:
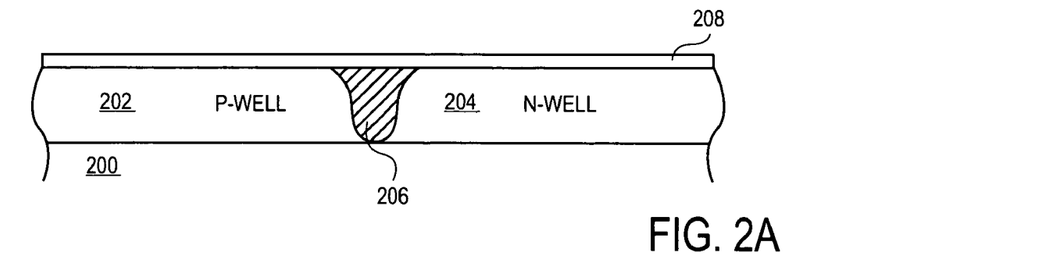
FIGS. 2A–2J illustrate a method of forming a highly doped polysilicon thin film for use as gate electrodes in a CMOS integrated circuit.

In an embodiment of the present invention, a substrate 200, such as shown in FIG. 2A, is provided. Substrate 200 can be a monocrystalline silicon substrate or any other well known semiconductor substrates, such as but not limited to gallium arsenide substrate, indium phosphate (InP) substrates, silicon germanium (SiGe) substrates, and silicon on insulator (SOI) substrates. In an embodiment of the present invention, substrate 200 includes a p well doped to a p type conductivity between 0.5–1 k$\Omega$/□ where an NMOS device will be fabricated and n well doped to an n type conductivity level between 0.5–1 k$\Omega$/□ where a PMOS device will be fabricated. Substrate 200 can include an isolation region

206, such as a shallow trench isolation region (STI) to isolate the n well and p well from one another. In an embodiment of the present invention, a gate dielectric layer 208, such as a silicon dioxide layer, a silicon oxynitride layer, a silicon nitride layer, or combinations thereof is formed over substrate 200 as shown in FIG. 2A. Alternatively, the gate dielectric layer 208 can be high k gate dielectric layer, such as but not limited to hafnium oxide, zirconium oxide, titanium oxide and tantalum oxide.

Figure 2B:
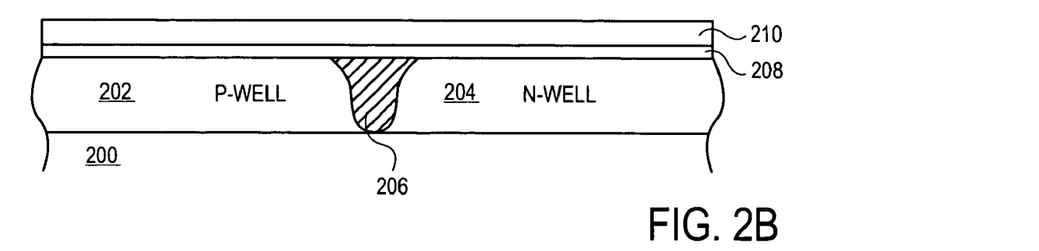

Next, as shown in FIG. 2B, a thin silicon film 210 is blanket deposited over gate dielectric layer 208 as shown in FIG. 2B. The thin silicon film 210 can be an amorphous silicon film or a polycrystalline silicon film. At this time, silicon film 210 is undoped. In an embodiment of the present invention, the silicon film 210 is formed to a thickness sufficient to prevent a subsequent ion implantation process used to dope the film from implanting through the silicon film 210. In an embodiment of the present invention, the silicon film 210 is formed to a thickness so that the laser power subsequently used to activate the dopants placed therein will be able to drive the dopants down to the lower portion of the silicon thin film 210 adjacent to the gate dielectric layer 208. In an embodiment of the present invention, the silicon thin film is formed to a thickness between 100–200Å. Any well known technique, such as chemical vapor deposition and sputtering can be utilized to deposit the polycrystalline or amorphous silicon thin film 210. In an embodiment of the present invention, the silicon thin film 210 is formed by chemical vapor deposition (CYD) utilizing a process gas chemistry comprising silane ($SiH_4$) and hydrogen ($H_2$) at a deposition temperature between 550–6500C and a deposition pressure between a few millitorrs to 500 millitorrs.

Figure 2C:
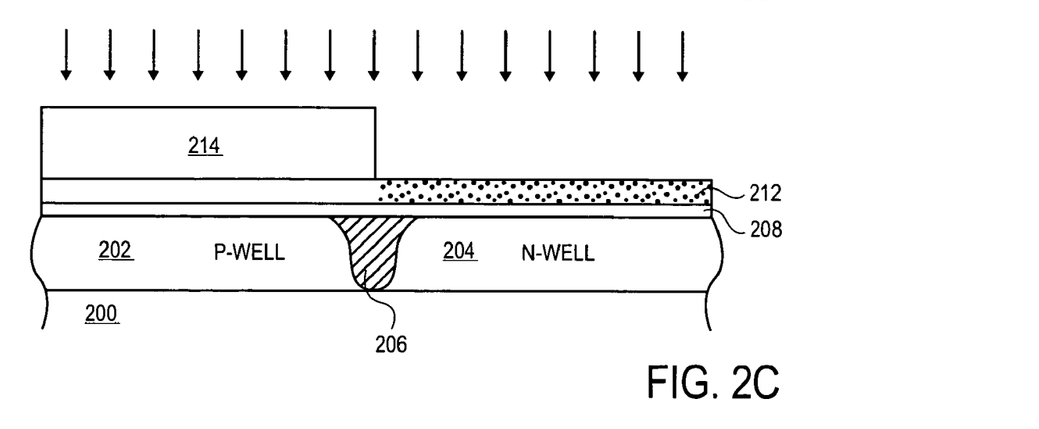

Next, p type dopants 212, such as boron ions, are placed into thin silicon film 210 formed over the n well 204 as shown in FIG. 2C. Dopants can be placed in thin film 210 by forming a photoresist mask 214 over the p well region 202 and leaving the thin film 210 over the n well exposed as shown in FIG. 2C. Ion implantation techniques are then used to implant p type dopants into the silicon thin film 210 over the n well 204. In an embodiment of the present invention, a low energy ion implantation process, (e.g., ion implantation energy of less than 2 KeV, and ideally less than 500 eV) is utilized to implant boron atoms into the silicon film 210. The implant energy is chosen to be sufficient to place dopant atoms near the bottom of the silicon film 210 but not sufficiently high to drive the dopants through the silicon film 210 and into the gate dielectric layer 208 and substrate 200. In an embodiment of the present invention, a high dose ion implantation process is used to form a highly doped silicon film 210. In an embodiment of the present invention, boron atoms are implanted at a dose of between $8\times10^{15}/cm^2$ and ideally at least $1\times10^{16}/cm^2$ in order to generate a dopant concentration of $\sim 3-6\times10^{21}/cm^3$. The photoresist mask 214 is then removed.

Figure 2D:
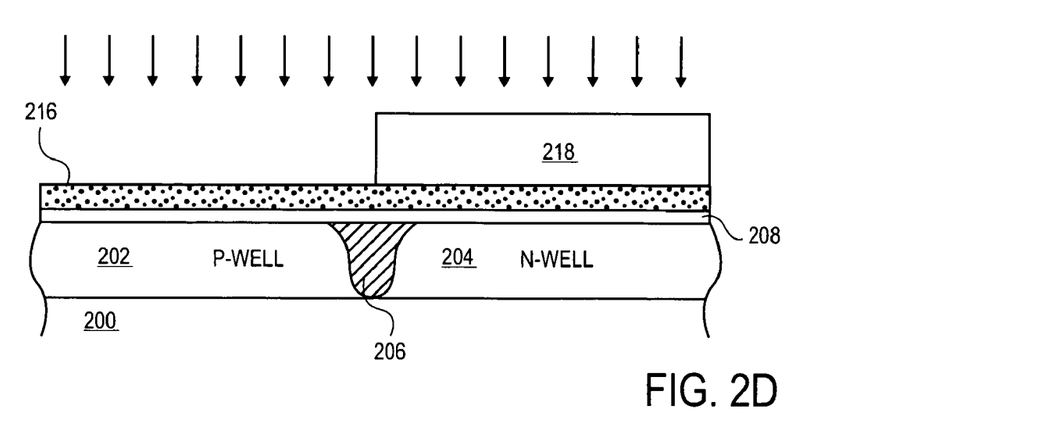

Next, as shown in FIG. 2D, n type dopants 216, such as arsenic or phosphorous, are placed into silicon film 210 over p well 202. N type dopants 216 can be placed in silicon film 210 by, for example, forming a photoresist mask 218 over the n well portion of substrate 200 and leaving the p well portion 202 unmasked as shown in FIG. 2D. N type dopants 216 can then be ion implanted into silicon film 210. In an embodiment of the present invention, a low energy (e.g., implant energy of less than 2 KeV and ideally less than 0.5 KeV) is utilized to implant arsenic or phosphorous into silicon film 210. The implant energy is chosen to be sufficient to place arsenic or phosphorous atoms near the bottom of the silicon film 210 but not too high so that dopants are driven through the silicon film 210 and into the gate dielectric layer 208 and substrate 200. In an embodiment of the present invention, arsenic or phosphorous atoms are implanted at a dose of between $8\times10^{15}/cm^2$ and ideally at least $1\times10^{16}/cm^2$ in order to generate a high dopant concentration of between $\sim 3-6\times10^{21}/cm^3$. The photoresist mask 218 is then removed.

Figure 2E:
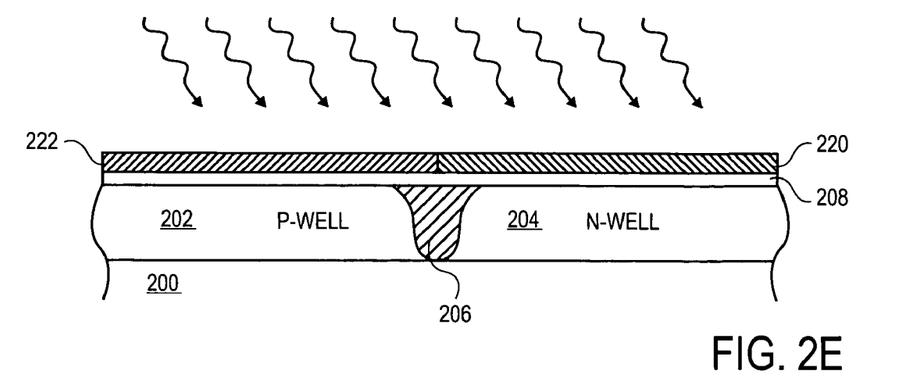

Next, as shown in FIG. 2E, the dopant atoms 212 in silicon film 210 over n well 204 and the dopant atoms 216 in silicon film 210 over p well 202 are activated so that they substitute with silicon atoms in the crystalline lattice in order to form a p type polycrystalline silicon film 220 and an n type polycrystalline silicon film 222. In an embodiment of the present invention, an ultra-fast annealing process or a "submelt" annealing process is used to activate the dopants. In a "submelt" annealing process, very high anneal temperatures are utilized but which are below the melting point of thin film 210. In an embodiment of the present invention, a laser anneal process is used to activate the n type and p type dopants. In an embodiment of the present invention, a laser annealing system that uses a very high temperature is used so that a very high activation efficiency is achieved. Additionally, in an embodiment of the present invention, the duration of the laser anneal used is short so that excessive diffusion is minimized. Utilizing laser systems with a high temperature and short pulse provides for maximum amount of dopani, activation. Additionally, because the laser anneal process is activating dopants in a thin film, a short duration anneal process can be used resulting in high dopant activity at the polysilicon/gate dielectric interface with minimal dopant out diffusion. If the thin activation film 210 was amorphous as deposited, the laser anneal process converts it into a polycrystalline silicon film. Additionally, because dopants in film 210 are activated by laser annealing prior to polysilicon patterning, no polysilicon "feet" or defects are created which can normally occur when a patterned polysilicon film melts due to being exposed to a laser annealing process. In an embodiment of the present invention, the n type and p type dopants are activated utilizing a laser with a large wavelength, such as 50 microns and having a laser pulse time of between 200–800 microseconds and a between 0.5 to 1 kilowatts/$mm^2$. In other embodiments, other types of laser systems may be utilized, such as for example, an excimer laser with nanosecond pulses. Other ultra-fast annealing techniques such as flash annealing might also be used to achieve a similar result. In an embodiment of the present invention, a flash annealing process is used to activate the dopants in silicon film 210. In a flash annealing process, once the anneal process reaches the peak temperature, the temperature is immediately reduced, providing a hold time of approximately zero second at the peak temperature. In an embodiment of the present invention, flash annealing processes is used with a peak temperature between 1050–1250° C. and ideally about 1200° C. in a nitrogen ambient. In an embodiment of the present invention, a flash anneal process is used wherein the substrate temperature is ramped up from about 500° C. to the peak temperature and then ramped back down to about 500° C. at a rate of about 300° C. /second.

Figure 2F:
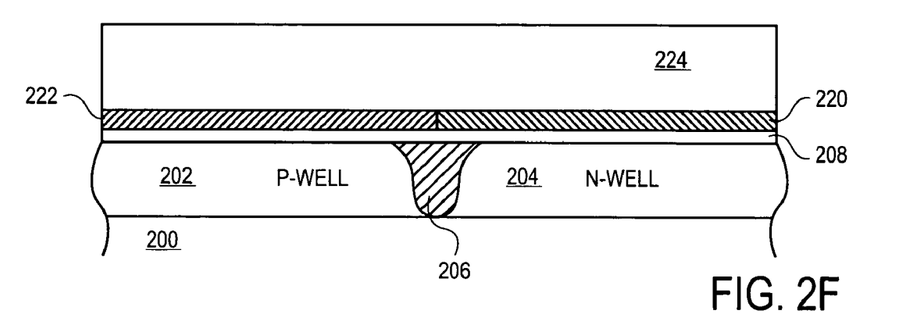

Next, as shown in FIG. 2F, an undoped polycrystalline silicon film capping layer 224 is blanket deposited onto the n type polysilicon film 222 and the p type polysilicon film 220. In an embodiment of the present invention, the undoped polysilicon capping layer 224 is formed to a thickness sufficient so that when added to the underlying doped polysilicon films 222 and 220, provides the thickness desired for gate electrodes for the NMOS and PMOS devices. In an embodiment of the present invention, the polysilicon film 224 is formed to a thickness sufficient to mask the channel regions from ion implantation when forming the source/drain regions for the devices but yet is not formed too thick to provide an unstable structure after patterning or formed to thick to prevent dopants from reaching the lower portion of the polysilicon film 224 near the interface with doped films 222 and 220. In an embodiment of the present invention, the undoped polysilicon capping layer 224 is formed to a thickness between 500–600Å. Any well known technique may be utilized to form undoped polysilicon capping layer 224, such as but not limited to chemical vapor deposition and sputtering. In an embodiment of the present invention, undoped polysilicon capping layer 224 is formed by chemical vapor deposition utilizing a process gas mixture comprising silane ($SiH_4$) and hydrogen ($H_2$) at a temperature between 550–650° C. and a pressure between a few millitorrs to 500 millitorrs.

Figure 2G:
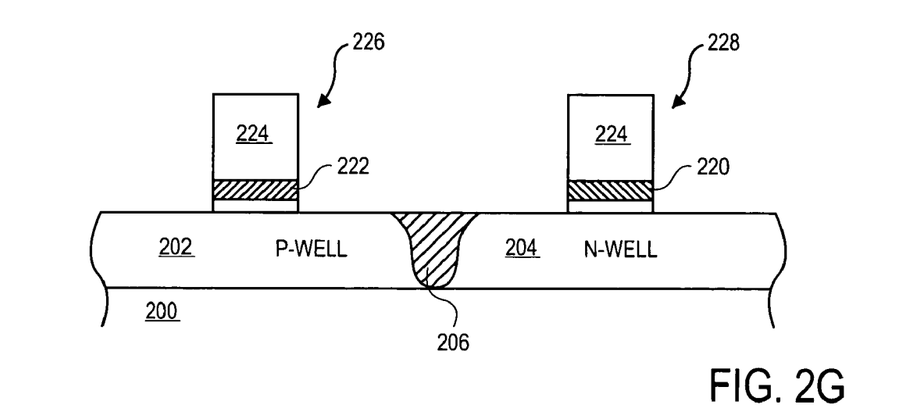

Next, as shown in FIG. 2G, the undoped polysilicon layer 224 and n type polycrystalline silicon film 222 are patterned into a gate electrode 226 for the n type device and undoped polysilicon capping layer 224 and p type polycrystalline film 220 are patterned in a gate electrode 228 for the PMOS as shown in FIG. 2G. Well known photolithography and etching techniques can be utilize to form, gate electrodes 226 and 228. For example, a photoresist mask can be formed, utilizing well known photolithography techniques, on top of polysilicon film 224 at locations where gate electrodes 226 and 228 are desired. The undoped polysilicon film 224 and the highly doped films 222 and 220 can then be etched with well known techniques in alignment with the photoresist mask to form gate electrodes 226 and 228. In an embodiment of the present invention, the undoped polysilicon film 224 and the n type polycrystalline silicon film 222 and p type polycrystalline silicon film are etched utilizing a reactive ion etching process with a chemistry comprising chlorine and bromine.

Figure 2H:
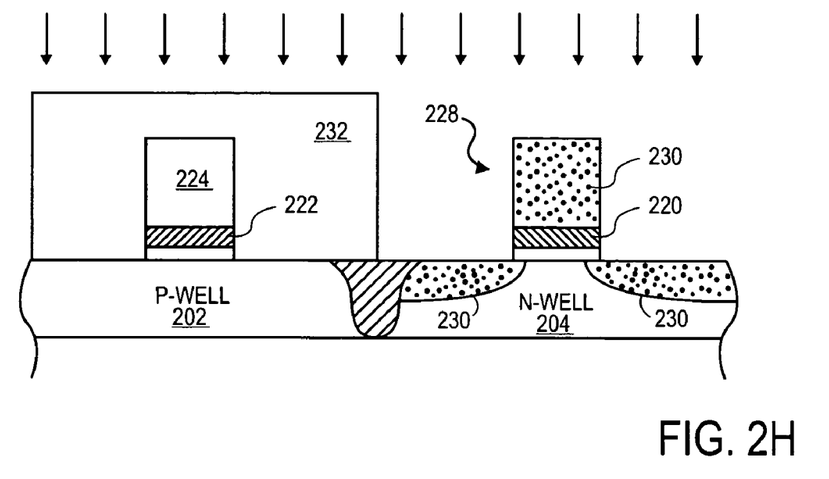
Figure 2I:
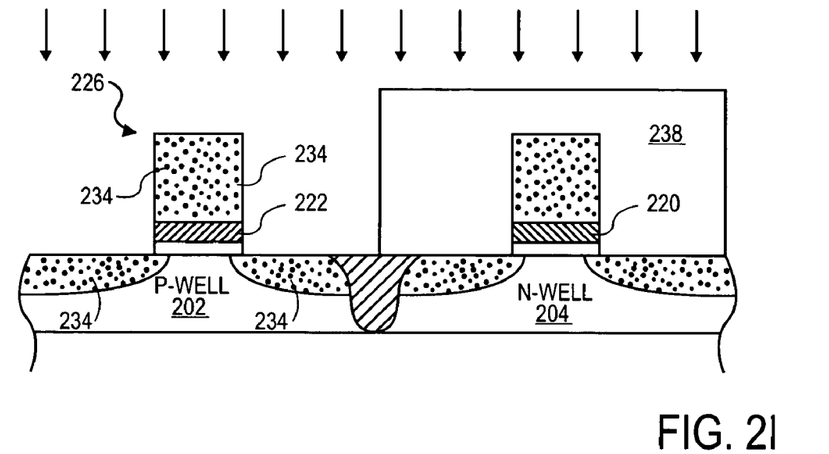
Figure 2J:
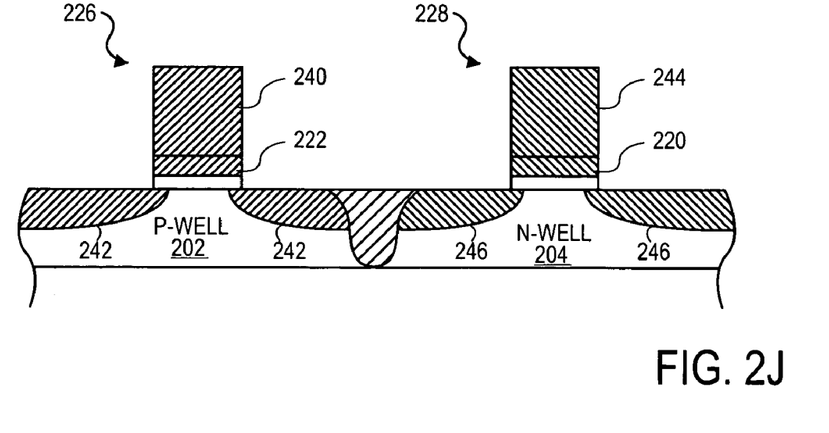

Next, as shown in FIGS. 2H–2J, source/drain regions are formed in semiconductor substrate 200 and the undoped capping layer 224 of gate electrodes 226 and 228 are doped.

In an embodiment of the present invention, as shown in FIG. 2H, p type dopants 230, such as phosphorous and arsenic are placed in n well 204 of substrate 200 in alignment with the outside edges of gate electrode 228 as well as in undoped capping layer 224 of gate electrode 228. In an embodiment of the present invention, a photoresist mask 232 is formed over the p well of substrate 200 and n well left unmasked. Ion implantation is then utilized to implant p type impurities 230 in substrate 200 in alignment with the outside edges of gate electrode 228 as well as into undoped polysilicon film 224. In an embodiment of the present invention, the implant energy is determined by the depth desired for the shallowest portion of the source/drain regions, such as source/drain extensions. In an embodiment of the present invention, the implant energy is chosen so that source/drain regions having a depth of approximately 300–400 Å are formed. It is to be appreciated that because the lower portion of gate electrode 228 already includes highly doped p type polycrystalline silicon film 220 adjacent to the gate dielectric layer 208, there is no need to utilize high implant energy so that the dopants reach the gate oxide interface. In this way, the implant energy can be dictated by the depth desired of the source/drain region and not by the energy required to drive dopants down to the gate oxide interface. In this way, extremely shallow and abrupt source/drain junction can be formed and device performance improved. Additionally, the ion implantation dose can be tailored to achieve the concentration desired for the source/drain regions as opposed to the dose necessary to achieve a highly doped polycrystalline silicon film for the lower portion of the gate electrode. In an embodiment of the present invention, the source/drain implant utilizes a lower dopant does or concentration than the dopant dose or concentration used to dope lower polysilicon film 220. In embodiments of the present invention, boron atoms are ion implanted at a does between $8–10\times10^{15}/cm^2$ and an energy between 3–5 keV in order to form p type source/drain regions having a concentration between $1–2\times10^{21}/cm^3$.

In an embodiment of the present invention, as shown in FIG. 2I, n type dopants 234, such as phosphorous and arsenic, are placed in p well 202 of substrate 200 in alignment with the outside edges of gate electrode 226 as well as in undoped capping layer 224 of gate electrode 226. In an embodiment of the present invention, dopants 234 are placed in p well 202 and in polysilicon film 224 by forming a photoresist mask 238 is over the p well of substrate 200 and leaving n well unmasked. Ion implantation is then utilized to implant n type impurities 234 into substrate 200 in alignment with the outside edges of gate electrode 228 as well as into undoped polysilicon film 224. In an embodiment of the present invention, the implant energy is used is determined by the depth desired for the shallowest portion of the source/drain regions, such as source/drain extensions or tip regions. In an embodiment of the present invention, the implant energy is chosen so that source/drain regions having a depth of approximately 300–400 Å can be formed. It is to be appreciated that because the lower portion of gate electrode 226 already includes highly doped n type polycrystalline silicon film 222 adjacent to the gate dielectric layer 208, there is no need to utilize high implant energy so that the dopants reach the gate oxide interface. In this way, the implant energy can be dictated by the depth desired of the source/drain region and not by the energy required to drive dopants down to the gate oxide interface. In this way, extremely shallow and abrupt source/drain junction can be formed and device performance improved. Additionally, in embodiments of the present invention, the ion implantation dose can be tailored to achieve the concentration desired for the source/drain regions as opposed to the does necessary to achieve a highly doped polycrystalline silicon film for the lower portion of the gate electrode. In an embodiment of the present invention, the source/drain implant utilizes a lower dose or concentration than used to dope lower polysilicon film 222. In an embodiment of the present invention, arsenic or phosphorous atoms are implanted at a dose between $8–10\times10^{15}/cm^2$ and an energy between 6–10 keV (P) or 10–15 keV (As) to form n type source/drain regions having a concentration between $1–2\times10^{21}/cm^3$.

Next, as shown in FIG. 2J, the n type dopants 234 and the p type dopants 230 are activated to form n type source/drain regions 242 and an n type polysilicon film 240 as well as p type source/drain regions 246 and a p type polysilicon film 244. In an embodiment of the present invention, the p type and n type dopants are activated and substitute with silicon atoms in the polycrystalline silicon film and the silicon substrate utilizing a rapid thermal annealing (RTA) process. In an embodiment of the present invention, a relatively low activation anneal temperature of less than 1000° C., and ideally between 950–900° C. is used to activate the dopants. In an embodiment of the present invention, a well known spike anneal process is utilized. A relatively low temperature can be utilized to activate the dopants because the lower portions of the gate electrodes 226 and 228 already comprise highly doped n type polysilicon 222 and p type polysilicon 220, respectively, so that a high temperature anneal or long duration anneal is not necessary to drive the dopants from the top of the polysilicon film down to the gate electrode/gate dielectric interface. In this way, the implant energy and activation temperature/time can be tailored for the depth desired of the source/drain regions and not dictated by the requirements to drive dopants down to the gate oxide interface. In this way, vary shallow and abrupt source/drain junctions can be formed and device performance improved.

At this time, the fabrication of a PMOS and NMOS device is complete. The process of the present invention has fabricated a bi-layer polysilicon gate electrode 226 for an n type device comprising a lower highly doped n type polysilicon film 222 and an upper n type polysilicon film 240 and has formed a highly doped bi-layer polysilicon gate electrode 228 for a p type device comprising a lower highly doped p type polysilicon film 220 and an upper p type polysilicon film 244. If desired, additional and well known fabrication steps can be carried out, such as the formation of sidewall spacers, heavy doped source/drain contact regions, as well as the formation of silicide on the source/drain contact regions and on the top of the gate electrode 226 and 228.

Thus, a method of forming a highly doped polysilicon thin film has been described.

We claim:

1. A method of forming a doped polysilicon comprising:
forming a first silicon film on a substrate;
selectively doping a first portion of said first silicon film to form a doped first portion of said first silicon film having a first dopant concentration;
selectively doping a second portion of said first silicon film to form a doped second portion of said first silicon film having the first dopant concentration, wherein said second portion is different from said first portion;
forming a second silicon film on said doped first silicon film;
patterning the first silicon and the second silicon film into a gate electrode; and
after the patterning, doping said second silicon film to form a second doped film having a second dopant concentration hat is less than the first dopant concentration.

2. The method of claim 1 wherein said doping of said firs: silicon film comprises ion implanting said first silicon film and laser annealing said first silicon film to activate said dopants.

3. The method of claim 2 wherein said ion implantation occurs at an energy of less than 2 KeV.

4. The method of claim 2 wherein said laser annealing comprises exposing said first silicon film to a high wavelength laser having an energy density between 0.5 to 1 kilowatts/mm$^2$.

5. The method of claim 1 wherein said doping of said second silicon film comprises ion implanting dopants into said second silicon film and rapid thermal annealing said second silicon film.

6. The method of claim 5 wherein said rapid thermal annealing occurs at a temperature less than 1000° C.

7. The method of claim 6 wherein said second silicon film is annealed at a temperature between 900–950° C.

8. The method of claim 1 wherein said first silicon film is formed to a thickness between 100–200 Å.

9. The method of claim 8 wherein said second silicon film is formed to a thickness between 500–600 Å.

10. A method of forming a doped polycrystalline silicon film comprising:
forming a first silicon film;
selectively implanting dopants into a first portion of said first silicon film to the first dopant concentration;
selectivity implanting dopants into a second portion of said first silicon film to the first dopant concentration, wherein said first portion is different from said second portion;
activating said dopants in said first silicon film by annealing said first silicon film;
forming a second polycrystalline silicon film on said doped and laser annealed first silicon film;
patterning said first silicon film and said second polycrystalline silicon film into a gate electrode of a metal oxide semiconductor transistor;
after the patterning, ion implanting dopants into said second polycrystalline silicon film to a second dopant concentration that is less than the first dopant concentration; and
activating said dopants in said second polycrystalline silicon by rapid thermal annealing said second polycrystalline silicon film.

11. The method of claim 10 wherein said dopants in said first silicon film are activated utilizing a laser annealing process.

12. The method of claim 10 wherein said dopants in said first silicon film are activated utilizing a flash annealing process.

13. The method of claim 10 wherein said ion implantation Into said first film comprises implanting dopants at an energy less than 2 KeV.

14. The method of claim 11 wherein said laser annealing of said first silicon film comprises exposing said first silicon film to a laser having a high wavelength and an energy density between 0.5 to 1 kilowatts/mm$^2$ with a pulse rime of between 200–800 microseconds.

15. The method of claim 10 wherein said rapid thermal annealing of said second polycrystalline silicon film comprises heating said second silicon film to a temperature less than 1000° C.

16. A method of forming a CMOS integrated circuit comprising:
forming a gate dielectric layer having a p type conductivity substrate region and a n type conductivity substrate region;
forming a first silicon film on said gate dielectric layer on said n type and p type conductivity regions of said semiconductor substrate;
implanting p type conductivity type ions into said first silicon film fanned over said n type conductivity region;
implanting n type conductivity ions into said first silicon film over said p type conductivity region of said substrate;
annealing said first silicon film to activate said p type conductivity Ions and said a type conductivity ions in said first silicon film to form a p type first silicon film and a n type first silicon film, respectively;
forming a second silicon film comprising polycrystalline silicon on said first silicon formed over said n type conductivity region and said p type conductivity region;
patterning said second silicon film and said p type first silicon film into a first gate electrode over said n type conductivity substrate region and said second film and said n type first silicon film into a second gate electrode over said p type conductivity substrate region;

implanting n type dopants into said second silicon film of said second gate electrode and into said p type conductivity region substrate on opposite sides of said second gate electrode;

implanting p type conductivity ions into said second film of said first gate electrode and into said n type conductivity substrate region on opposite sides of said first gate electrode; and rapid thermal annealing said substrate to activate said p type conductivity ions in said second film and in said n type conductivity substrate region to form p type source/drain regions and to active said n type conductivity ions in said second film and In said p type conductivity substrate region to form a pair of n type source/drain regions.

17. The method of claim 16 wherein said dopants in said first silicon film are activated utilizing a laser annealing process.

18. The method of claim 16 wherein said dopants in said first silicon film are activated utilizing a flash annealing process.

19. The method of claim 17 wherein said laser annealing comprises exposing said first silicon film to a high wavelength laser utilizing an energy density between 0.5 to 1 kilowatts/mm$^2$ with a pulse time of approximately 200–800 microseconds.

20. The method of claim 16 wherein said rapid thermal annealing occurs at a temperature less than 1000° C.

21. The method of claim 20 wherein said rapid thermal annealing occurs at a temperature between 900–950° C.

22. The method of claim 16 wherein said first silicon film is formed by chemical vapor deposition utilizing a process gas comprising silane ($SiH_4$), and hydrogen ($H_2$) at a temperature between 550–650° C.

23. The method of claim 16 wherein second polycrystalline silicon film is an undoped polycrystalline silicon film.

24. A method of forming a highly doped polycrystalline silicon structure comprising:
   forming a first silicon film;
   selectivity implanting dopants into a first portion of said first silicon film
   selectivity implanting dopants into a second portion of said first silicon film, wherein said first portion is different from said second portion;
   activating said dopants in said first silicon film with an ultrablast annealing process;
   forming a second polycrystalline silicon film on said doped and annealed first silicon film;
   patterning said second polycrystalline silicon film and said doped and annealed first silicon film into a patterned structure;
   ion implanting dopants into said second polycrystalline silicon film of said patterned polycrystalline silicon structure to a dopant concentration that is less than a dopant concentration of dopants in said first silicon film; and
   activating said dopants in said second polycrystalline silicon film of said polycrystalline silicon structure.

25. The method of claim 24 wherein said dopants in said second polycrystalline silicon film are activated by a rapid thermal annealing process.

26. The method of claim 24 wherein said ion implantation into said first silicon film comprises implanting dopants at an energy less than 2 KeV.

27. The method of claim 25 wherein said rapid thermal annealing of said second polycrystalline silicon film comprises heating said polycrystalline silicon film to a temperature less than 1000° C.

28. The method of claim 24 wherein said dopants in said first silicon film are activated utilizing a laser annealing process.

29. The method of claim 24 wherein said dopants in said first silicon film are activated utilizing a flash annealing process.

30. A method of forming a doped polysilicon comprising:
   forming a first silicon film on a substrate, wherein said first silicon film is formed to a thickness between 100–200 Å;
   doping said first silicon film to form a doped first silicon film having a first dopant concentration;
   forming a second silicon film on said doped first silicon film, wherein said second silicon film is formed to a thickness between 500–600 Å;
   doping said second silicon film to form a second doped film having a second dopant concentration that is less than the first dopant concentration; and
   patterning the first silicon and the second silicon film into a gate electrode.

31. A method of forming a doped polycrystalline silicon film comprising:
   forming a first silicon film;
   implanting dopants into said first silicon film to a first dopant concentration;
   activating said dopants in said first silicon film by laser annealing said first silicon film, wherein said laser annealing comprises exposing said first silicon film to a laser having a high wavelength and an energy density between 0.5 to 1 kilowatts/mm$^2$ with a pulse time of between 200–800 microseconds;
   forming a second polycrystalline silicon film on said doped and laser annealed first silicon film;
   ion implanting dopants into said second polycrystalline silicon film to a second dopant concentration that is less than the first dopant concentration;
   activating said dopants in said second polycrystalline silicon by rapid thermal annealing said second polycryastalline silicon film; and
   patterning the first silicon film and the second polycrystalline film into a gate electrode of a metal oxide semiconductor transistor.

32. A method of forming a doped polycrystalline silicon film comprising:
   forming a first silicon film;
   implanting dopants into said first silicon film to a first dopant concentration;
   activating said dopants in said first silicon film by annealing said first silicon film;
   forming a second polycrystalline silicon film on said doped and laser annealed first silicon film;
   ion implanting dopants into said second polycrystalline silicon film to a second dopant concentration that is less than the first dopant concentration;
   activating said dopants in said second polycrystalline silicon film by rapid thermal annealing said second polycryastalline silicon film; and
   patterning the first silicon film and the second polycrystalline film into a gate electrode of a metal oxide semiconductor transistor, wherein said doped and annealed first silicon film and said second silicon film are patterned prior to implanting said second silicon film.

* * * * *

UNITED STATES PATENT AND TRADEMARK OFFICE
CERTIFICATE OF CORRECTION

| | | |
|---|---|---|
| PATENT NO. | : 7,138,307 B2 | Page 1 of 1 |
| APPLICATION NO. | : 10/912632 | |
| DATED | : November 7, 2006 | |
| INVENTOR(S) | : Ranade et al. | |

It is certified that error appears in the above-identified patent and that said Letters Patent is hereby corrected as shown below:

In column 7, at line 42, delete "hat" and insert --that--.

In column 7, at line 44, delete ":" and insert --t--.

In column 9, at line 45, delete "ultrablast" and insert --ultra-fast--.

Signed and Sealed this

Fourth Day of September, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,138,307 B2 | |
| APPLICATION NO. | : 10/912632 | |
| DATED | : November 21, 2006 | |
| INVENTOR(S) | : Ranade et al. | |

It is certified that error appears in the above-identified patent and that said Letters Patent is hereby corrected as shown below:

In column 7, at line 42, delete "hat" and insert --that--.

In column 7, at line 44, delete ":" and insert --t--.

In column 9, at line 45, delete "ultrablast" and insert --ultra-fast--.

This certificate supersedes Certificate of Correction issued September 4, 2007.

Signed and Sealed this

Ninth Day of October, 2007

JON W. DUDAS
*Director of the United States Patent and Trademark Office*